(12) United States Patent  
Szekeresch et al.

(10) Patent No.: US 6,919,538 B2
(45) Date of Patent: Jul. 19, 2005

(54) METHOD FOR THERMALLY TREATING SUBSTRATES (75) Inventors: Jakob Szekeresch, Schönberg (DE); Peter Dress, Bruchsal (DE); Uwe Dietze, Austin, TX (US); Werner Saule, Bretten (DE)

(73) Assignee: Steag HamaTech AG (DE)

( * ) Notice: Subject to any disclaimer, the term of this patent is extended or adjusted under 35 U.S.C. 154(b) by 0 days.

(21) Appl. No.: 10/433,253

(22) PCT Filed: Nov. 28, 2001

(86) PCT No.: PCT/EP01/13905

§ 371 (c)(1),
(2), (4) Date: Jul. 17, 2003

(87) PCT Pub. No.: WO02/45135

PCT Pub. Date: Jun. 6, 2002

(65) Prior Publication Data

US 2004/0195229 A1 Oct. 7, 2004

(30) Foreign Application Priority Data

Dec. 1, 2000 (DE) .......................................... 100 59 665

(51) Int. Cl.⁷ .................................................. F27B 5/14
(52) U.S. Cl. ...................... 219/390; 219/405; 219/411; 219/448.19; 219/494; 219/458.1; 219/477; 392/416; 392/418; 118/724; 118/725; 118/728; 118/50.1
(58) Field of Search ................................ 219/390, 405, 219/411, 448.19, 448.18, 494, 448.13, 458.1, 477–478; 392/416, 418; 118/724, 725, 728, 730, 50.1

(56) References Cited

U.S. PATENT DOCUMENTS

| | | | |
|---|---|---|---|
| 5,650,082 A | 7/1997 | Anderson | |
| 5,740,016 A | 4/1998 | Dhindsa | |
| 5,790,750 A | 8/1998 | Anderson | |
| 6,184,498 B1 * | 2/2001 | Kiyama | ...................... 219/390 |

FOREIGN PATENT DOCUMENTS

| | | |
|---|---|---|
| DE | 19907497 | 8/2000 |
| WO | WO99/23690 | 5/1999 |
| WO | WO00/01628 | 1/2000 |
| WO | WO00/51170 | 8/2000 |

* cited by examiner

*Primary Examiner*—Shawntina Fuqua
(74) *Attorney, Agent, or Firm*—Robert W Becker & Associates; Robert W Becker (57) ABSTRACT

To increase the temperature homogeneity on the surface of a substrate that is to be thermally treated, a method for thermally treating substrates is provided, according to which the substrate is heated by several separately controllable heating elements. A desired-value profile is predefined for each of said heating elements. The method comprises the following steps: locally-analysed measurement of the temperature of the surface of the substrate that faces away from the heating elements, during the thermal treatment; determination of the temperature inhomogeneities occurring on the substrate surface; definition of new desired-value profiles based on said temperature inhomogeneities; and preparation of the new desired-value profiles for subsequent treatments.

15 Claims, 7 Drawing Sheets

| | MNo1 | MNo2 | MNo3 | MNo4 | MNo5 | MNo6 | MNo7 | MNo8 | MNo9 | MNo10 | MNo11 | MNo12 | MNo13 | TOTAL |
|---|---|---|---|---|---|---|---|---|---|---|---|---|---|---|
| ZONE1  | 100 | 0  | 0   | 0  | 0  | 0  | 0  | 0  | 0  | 0  | 0   | 0  | 0   | 100 |
| ZONE2  | 75  | 25 | 0   | 0  | 0  | 0  | 0  | 0  | 0  | 0  | 0   | 0  | 0   | 100 |
| ZONE3  | 20  | 60 | 20  | 0  | 0  | 0  | 0  | 0  | 0  | 0  | 0   | 0  | 0   | 100 |
| ZONE4  | 0   | 25 | 75  | 0  | 0  | 0  | 0  | 0  | 0  | 0  | 0   | 0  | 0   | 100 |
| ZONE5  | 0   | 0  | 100 | 0  | 0  | 0  | 0  | 0  | 0  | 0  | 0   | 0  | 0   | 100 |
| ZONE6  | 75  | 0  | 0   | 0  | 0  | 25 | 0  | 0  | 0  | 0  | 0   | 0  | 0   | 100 |
| ZONE7  | 50  | 0  | 0   | 50 | 0  | 0  | 0  | 0  | 0  | 0  | 0   | 0  | 0   | 100 |
| ZONE8  | 0   | 80 | 0   | 0  | 0  | 0  | 20 | 0  | 0  | 0  | 0   | 0  | 0   | 100 |
| ZONE9  | 0   | 0  | 50  | 0  | 50 | 0  | 0  | 0  | 0  | 0  | 0   | 0  | 0   | 100 |
| ZONE10 | 0   | 0  | 75  | 0  | 0  | 0  | 0  | 25 | 0  | 0  | 0   | 0  | 0   | 100 |
| ZONE11 | 25  | 0  | 0   | 0  | 0  | 50 | 0  | 0  | 10 | 0  | 25  | 0  | 0   | 110 |
| ZONE12 | 0   | 0  | 0   | 0  | 0  | 75 | 5  | 0  | 5  | 5  | 0   | 0  | 0   | 90  |
| ZONE13 | 0   | 0  | 0   | 0  | 0  | 0  | 80 | 0  | 0  | 10 | 0   | 0  | 0   | 90  |
| ZONE14 | 0   | 0  | 0   | 10 | 0  | 0  | 5  | 75 | 0  | 0  | 0   | 0  | 0   | 90  |
| ZONE15 | 0   | 0  | 25  | 5  | 5  | 0  | 0  | 50 | 0  | 0  | 0   | 0  | 25  | 110 |
| ZONE16 | 0   | 0  | 0   | 0  | 10 | 25 | 0  | 0  | 50 | 0  | 75  | 0  | 0   | 160 |
| ZONE17 | 0   | 0  | 0   | 0  | 0  | 0  | 0  | 0  | 0  | 0  | 50  | 80 | 0   | 130 |
| ZONE18 | 0   | 0  | 0   | 0  | 0  | 0  | 20 | 0  | 0  | 50 | 0   | 0  | 0   | 70  |
| ZONE19 | 0   | 0  | 0   | 0  | 0  | 0  | 0  | 0  | 0  | 0  | 0   | 0  | 50  | 50  |
| ZONE20 | 0   | 0  | 0   | 0  | 0  | 0  | 0  | 25 | 0  | 0  | 0   | 0  | 75  | 100 |
| ZONE21 | 0   | 0  | 0   | 0  | 0  | 0  | 0  | 0  | 0  | 0  | 100 | 0  | 0   | 100 |
| ZONE22 | 0   | 0  | 0   | 0  | 0  | 0  | 0  | 0  | 0  | 0  | 75  | 25 | 0   | 100 |
| ZONE23 | 0   | 0  | 0   | 0  | 0  | 0  | 0  | 0  | 0  | 0  | 20  | 60 | 20  | 100 |
| ZONE24 | 0   | 0  | 0   | 0  | 0  | 0  | 0  | 0  | 0  | 0  | 0   | 25 | 75  | 100 |
| ZONE25 | 0   | 0  | 0   | 0  | 0  | 0  | 0  | 0  | 0  | 0  | 0   | 0  | 100 | 100 |

| T [s] | ZONE 1 [°C] | ZONE 2 [°C] | ZONE 3 [°C] | ZONE 4 [°C] | ZONE 5 [°C] | ZONE 6 [°C] | ZONE 7 [°C] | ZONE 8 [°C] | ZONE 9 [°C] | ZONE 10 [°C] | ZONE 11 [°C] | ZONE 12 [°C] | ZONE 13 [°C] |
|---|---|---|---|---|---|---|---|---|---|---|---|---|---|
| 1 | 90,0 | 90,0 | 111,3 | 90,0 | 90,0 | 90,0 | 109,7 | 111,3 | 107,2 | 90,0 | 114,1 | 114,1 | 114,7 |
| 60 | 90,0 | 90,0 | 111,6 | 90,0 | 90,0 | 90,0 | 109,6 | 111,6 | 108,4 | 90,0 | 111,5 | 111,5 | 117,4 |
| 60 | 90,0 | 90,0 | 110,7 | 90,0 | 90,0 | 90,0 | 109,1 | 110,7 | 108,0 | 90,0 | 111,8 | 111,8 | 117,7 |
| 60 | 90,0 | 90,0 | 109,8 | 90,0 | 90,0 | 90,0 | 110,4 | 109,8 | 108,4 | 90,0 | 112,3 | 112,3 | 112,7 |
| 60 | 110,4 | 110,4 | 111,0 | 108,9 | 108,9 | 110,4 | 110,4 | 111,0 | 109,5 | 108,9 | 111,7 | 111,7 | 111,0 |
| 120 | 109,4 | 109,4 | 110,9 | 110,0 | 110,0 | 109,4 | 109,4 | 110,9 | 110,0 | 110,0 | 110,9 | 110,9 | 109,8 |
| 120 | 109,4 | 109,4 | 110,3 | 110,3 | 110,3 | 109,4 | 109,4 | 110,3 | 110,3 | 110,3 | 110,1 | 110,1 | 110,0 |
| 120 | 109,3 | 109,3 | 110,2 | 110,2 | 110,2 | 109,3 | 109,3 | 110,2 | 110,2 | 110,2 | 110,1 | 110,1 | 109,8 |
| 120 | 109,3 | 109,3 | 110,2 | 110,2 | 110,2 | 109,3 | 109,3 | 110,2 | 110,2 | 110,2 | 110,0 | 110,0 | 109,6 |
| 120 | 109,3 | 109,3 | 110,2 | 110,2 | 110,2 | 109,3 | 109,3 | 110,2 | 110,2 | 110,2 | 110,0 | 110,0 | 109,7 |

| T [s] | ZONE 14 [°C] | ZONE 15 [°C] | ZONE 16 [°C] | ZONE 17 [°C] | ZONE 18 [°C] | ZONE 19 [°C] | ZONE 20 [°C] | ZONE 21 [°C] | ZONE 22 [°C] | ZONE 23 [°C] | ZONE 24 [°C] | ZONE 25 [°C] |
|---|---|---|---|---|---|---|---|---|---|---|---|---|
| 1 | 112,6 | 112,6 | 90,0 | 104,0 | 108,6 | 107,5 | 90,0 | 90,0 | 90,0 | 108,6 | 90,0 | 90,0 |
| 60 | 111,7 | 111,7 | 90,0 | 103,9 | 108,2 | 107,3 | 90,0 | 90,0 | 90,0 | 108,2 | 90,0 | 90,0 |
| 60 | 110,1 | 110,1 | 90,0 | 106,0 | 108,3 | 106,5 | 90,0 | 90,0 | 90,0 | 108,3 | 90,0 | 90,0 |
| 60 | 109,0 | 109,0 | 90,0 | 109,2 | 108,5 | 108,2 | 90,0 | 90,0 | 90,0 | 108,5 | 90,0 | 90,0 |
| 60 | 109,3 | 109,3 | 107,9 | 108,8 | 108,5 | 109,1 | 107,9 | 107,9 | 107,9 | 108,5 | 107,9 | 107,9 |
| 120 | 110,4 | 110,4 | 109,3 | 109,3 | 110,0 | 110,1 | 110,1 | 109,3 | 109,3 | 110,0 | 110,1 | 110,1 |
| 120 | 110,1 | 110,1 | 110,0 | 110,0 | 109,9 | 110,3 | 110,3 | 110,0 | 110,0 | 109,9 | 110,3 | 110,3 |
| 120 | 110,0 | 110,0 | 110,0 | 110,0 | 109,8 | 110,4 | 110,4 | 110,0 | 110,0 | 109,8 | 110,4 | 110,4 |
| 120 | 110,1 | 110,1 | 110,1 | 110,1 | 109,9 | 110,3 | 110,3 | 110,1 | 110,1 | 109,9 | 110,4 | 110,4 |
| 120 | 110,1 | 110,1 | 110,0 | 110,0 | 109,9 | 110,3 | 110,3 | 110,0 | 110,0 | 109,9 | 110,3 | 110,3 |

METHOD FOR THERMALLY TREATING SUBSTRATES

BACKGROUND OF THE INVENTION

The present invention relates to a method for the thermal treatment of substrates, according to which the substrate is heated by a plurality of separately controllable heating elements.

Such apparatus are used, for example, in the semiconductor industry subsequent to lacquering processes of substrates, especially photomasks, in order to thermally treat the substrates for curing and chemical pretreatment of the layers. During the thermal treatment, it is important for the subsequent usability of the substrates that the applied layers be treated as uniformly and homogeneously as possible. In this connection, however, the problem occurs that during uniform control of the heating elements the substrates cannot be uniformly treated due to edge effects. It is therefore known to heat the heating elements less strongly in the edge region of the substrates at the beginning of the thermal treatment, since in the central portion initially a relatively greater mass must be heated. The heating elements are later heated more strongly in the edge portion of the substrates due to the increased thermal irradiation in these regions.

DE-A-199 07 497, which originates with this same applicant discloses, an apparatus and a method for the thermal treatment of substrates, according to which a plurality of separately controllable heating elements first heat a heating plate and then a substrate disposed thereon. The individual heating elements are respectively regulated by a PID regulator, whereby the necessary desired value is prescribed in the form of a desired-value profile. In this context, desired-value profile is understood to mean the determination of desired values that vary with time, especially in time intervals.

During a treatment process, the temperature distribution on the substrate surface facing away from the heating plate is determined and, as a function of the temperature distribution on the substrate surface relative to the desired-value profile, changed desired values are defined for the individual heating elements and are conveyed on to the respective PID regulator. This provides the possibility of undertaking corrections of the desired-value profiles during the treatment process in order to achieve an improved temperature homogeneity over the substrate surface.

However, this method has the problem that it can always react only to already-occurring temperature inhomogeneities on the substrate surface in order to subsequently correct them via a change of the desired-value profile of the individual heating elements. An anticipation of future temperature inhomogeneities that occur during the treatment is not possible. In addition, the problems that occur during one treatment, for example an increased temperature inhomogeneity at a specific temperature value, are not taken into account during the treatment of the next substrate, since the previously established desired-value profile is again prescribed for the individual heating elements. One can thus expect the same problems from the previous treatment to occur during the next treatment.

Proceeding from this state of the art, is therefore an object of the present invention to provide a method for the thermal treatment of substrates that enables a self-optimizing process control in order to increase the temperature homogeneity on the surface of a substrate that is to be treated.

SUMMARY OF THE INVENTION

Pursuant to the invention, the stated object is realized with a method for the thermal treatment of substrates, including the steps of: heating the substrate by a plurality of separately controllable heating elements, each of which has a prescribed desired-value profile, localized measuring of the temperature of that substrate surface facing away from the heating elements during the thermal treatment, determining temperature inhomogeneities occurring on the substrate surface, defining new desired-value profiles based on the determined temperature inhomogeneities, and providing the new desired-value profiles for subsequent treatment processes. This method enables a self-optimizing process control, since the desired-value profiles prescribed for the individual heating elements are newly defined and made available for subsequent treatment processes, so that temperature inhomogeneities occurring during the thermal treatment are taken into account during the definition of the new desired-value profiles and are thus prevented during the subsequent treatment. This results in a self-optimization of the desired-value profile, and hence a more homogeneous thermal treatment of the substrates.

Pursuant to a particularly preferred embodiment of the invention, a temperature inhomogeneity that occurs during the thermal treatment is taken into account in an anticipatory manner, in terms of time, during the definition of the new desired-value profiles. During the definition of the new desired-value profiles, jumps with regard to the homogeneity, which occur, for example, during a certain temperature or at a certain point in time in the treatment, can be taken into account prior to this temperature or the respective point in time being obtained, so that these temperature inhomogeneities can already be counteracted at lower temperatures or at earlier points in time. Thus, already before they have occurred, one can begin to compensate for the determined temperature inhomogeneities. This anticipatory taking into account of inhomogeneities that occur at specific points in time or at specific temperatures enables a greatly improved temperature homogeneity during the treatment.

The temperature of the substrate surface is preferably determined at predetermined surface points in order to reduce the calculating work necessary relative to systems where all surface points are taken into account. To increase the precision of the method, the average value of all measured temperature values on a surface region associated with a surface point is assigned to the surface points. In this connection, the association of the surface regions to the surface points remains constant during at least one measuring cycle in order to obtain uniform results over the measuring cycle.

Pursuant to a particularly preferred embodiment of the invention, the definition of the new desired-value profile is effected with the aid of a weighted association or coordination of the surface points to the individual heating elements, as a result of which the different influence of the heating elements to the various surface points is taken into account.

In order to obtain uniform results within a measuring cycle, the weighted association of the individual heating elements to the surface points remains constant during at least one measuring cycle. The weighted association of the individual heating elements to the surface points can, however, be varied during the definition of the new desired-value profile in order to also achieve an optimization with regard to the association.

The desired-value profiles provide desired-value changes in certain time intervals in order to produce a specific heating profile. To enable an improved adaptation of the desired-value, during the definition of the new desired-value profiles the time intervals for the desired-value changes are preferably newly selected.

A new definition of the desired-value profile is preferably effected only if temperature inhomogeneities occur above a prescribed threshold value, since with temperature inhomogeneities below the threshold value one proceeds from an optimized system which to the extent possible is no longer interfered with. During the thermal treatment the substrate is preferably disposed on a plate disposed between the heating elements and the substrate.

The inventive object is also realized with a method for the optimization of desired-value profiles of a plurality of separately controllable heating elements for the thermal treatment of substrates, whereby the heating elements are heated with the aid of respectively prescribed desired-value profiles, the temperature of the substrate surface facing away from the heating elements is locally measured during the heating and temperature inhomogeneities occurring on the substrate surface are determined as a function of time, whereby new desired-value profiles are defined based on the temperature inhomogeneities occurring during the treatment process and are used for a subsequent heating process, and whereby the aforementioned steps are repeated until, at every point in time of the heating, the temperature inhomogeneities are below a predetermined threshold value. In this way, as already indicated above, an optimized desired-value profile can be established.

The inventive method is preferably utilized with photomasks.

BRIEF DESCRIPTION OF THE DRAWINGS

The invention will be explained subsequently with the aid of a preferred embodiment in conjunction with the drawings; in the drawings.

DESCRIPTION OF THE PREFERRED EMBODIMENTS

Figure 1:
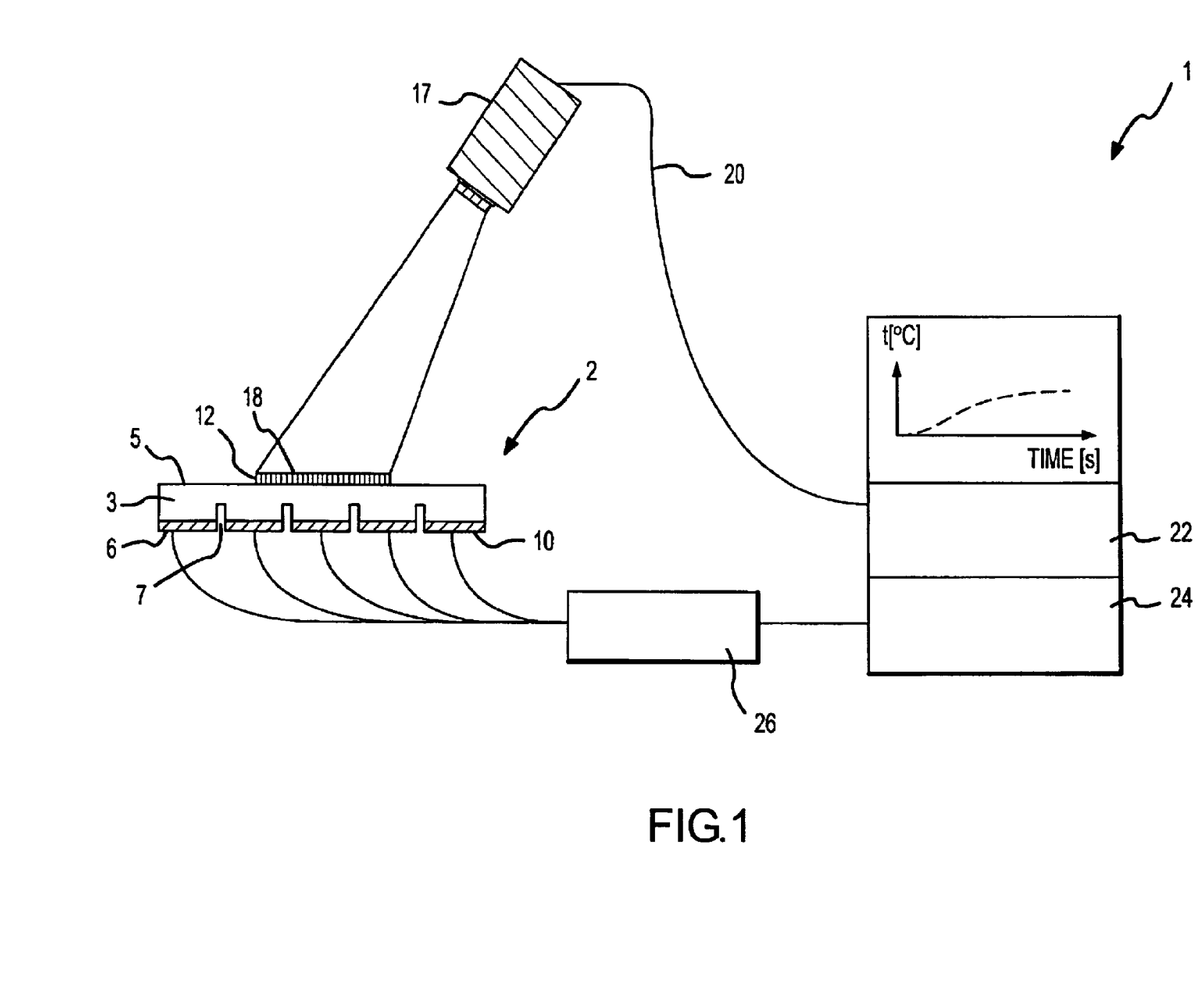
FIG. 1 shows a schematic side view of an inventive system for the thermal treatment of substrates.

FIG. 1 shows a schematic side view of an apparatus 1 for the thermal treatment of substrates.

Figure 2A:
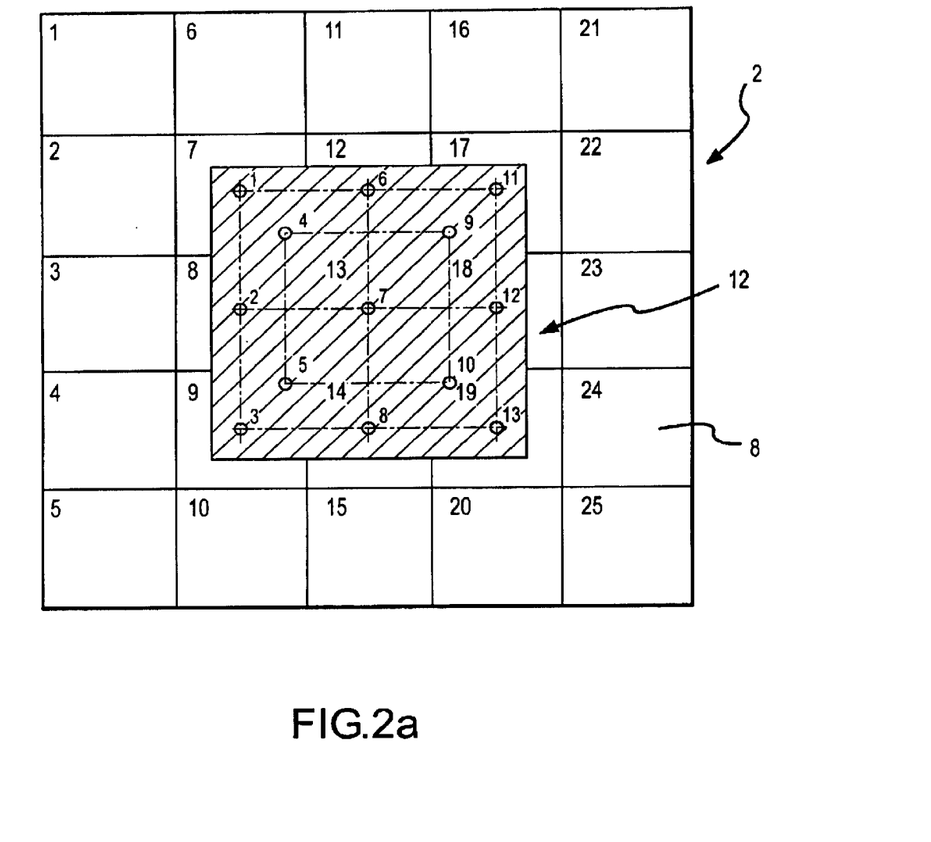
FIG. 2a shows a schematic illustration of a substrate disposed on a heating plate.

The apparatus 1 has a zone-controlled heating plate 2 that is comprised of a quadratic base plate 3 having an essentially right-angled cross-section. The base plate 3 has a first planar upper side 5 and a segmented underside 6. By means of four respective notches or grooves 7 that extend perpendicular to the side edges of the heating plate, the underside 6 is divided into a total of 25 square segments 8 (FIG. 2a). The depth of the grooves 7 corresponds approximately to half of the thickness of the base plate 3. Disposed upon the square segments 8 of the heating plate 2 are respective square heating elements 10, which are connected with the segments 8 of the base plate 3 in a suitable manner, such as by being adhesively joined thereto, and which form corresponding heating zones with the segments. Due to the arrangements of the heating elements 10 upon the segments 8, which are respectively separated by the grooves 7, the segments are thermally separated from one another so that they do not mutually influence one another, i.e. that no significant thermal cross talk occurs between the heating elements. However, via the base plate 3 the heating elements 10 are adequately thermally coupled with one another, so that on the upper side 5 of the base plate 3 a homogeneous temperature between the heating elements. However, via the base plate 3 the heating elements 10 are adequately thermally coupled with one another, so that on the upper side 5 of the base plate 3 a homogeneous temperature distribution is achieved without a thermal definition of the individual heating elements in the thermal pattern of the upper side 5. Associated with each heating element 10 is a non-illustrated temperature sensor in the form of a thermocouple element, which measures the actual temperature of the heating elements 10. In place of the thermocouple elements, it is also possible to use other, e.g. optical, temperature sensors.

Although the heating plate 2 was described as a one-piece base plate 3 having grooves 7 formed therein for the segmentation of the underside 6 of the base plate 3, it should be noted that the base plate 3 could be formed entirely planar, and the heating elements 10 could be connected with the base plate 3 directly or via spacer elements. In the same manner, the invention is not limited to the shape and number of the segments 8 and of the heating elements 10.

The planar upper side 5 of the base plate 3 of the heating plate 1 is disposed adjacent to a substrate 12 that is to be treated, e.g. with a spacing between 0.1 and 0.5 mm. The substrate is held over the heating plate 1, for example on four non-illustrated holding means. A temperature-measuring device 17 in the form of an infrared camera is disposed above the heating plate 1 and the substrate 12. The infrared camera 17 is directed onto an upper side 18 of the substrate 12 that faces away from the heating plate 1. The infrared camera 17 contains a non-illustrated scanning device having a moveable mirror via which the entire upper surface 18 of the substrate 12 is sequentially scanned. By means of the scanning device, a localized image or pattern of the temperature distribution of the upper side 18 of the substrate 12 is produced, whereby the entire surface is scanned, for example, once every second.

The infrared camera 17 is connected via a data line 20 with a computing unit in the form of a PC 22. Within the PC, the measured values obtained from the IR camera are processed and a spatial temperature distribution upon the upper surface 18 of the substrate is determined and is processed, as will be described in greater detail subsequently.

In FIG. 1 one can further see a process control mechanism 24, as well as a PID regulator 26 that is connected with the individual heating elements 10 and the non-illustrated temperature sensors, and forms a closed control loop with them. The PID regulator regulates the heating capacity of the individual heating elements 10 with the aid of a desired-value profile that is prescribed by the process control mechanism, i.e. a series of desired temperature values, especially time intervals, that vary with time, and the actual temperature values measured by the temperature sensors.

FIG. 2 shows a schematic plan view upon the heating plate 1 with a substrate 12, such as, for example, a photomask, disposed thereon. The heating zones formed by the heating elements 10 and the segments 8 are schematically indicated and are numbered 1 to 25. Indicated upon the substrate 12 are surface points 1 to 13 which, as will be described in greater detail subsequently, are used as association or coordination points.

As can be recognized in the schematic plan view of FIG. 2, the substrate covers the central nine of the entire 25 heating zones of the heating plate 2. Therefore, during a thermal treatment of the substrate mainly these nine zones are involved, although the remaining zones also have an influence upon the thermal treatment.

Figure 2B:
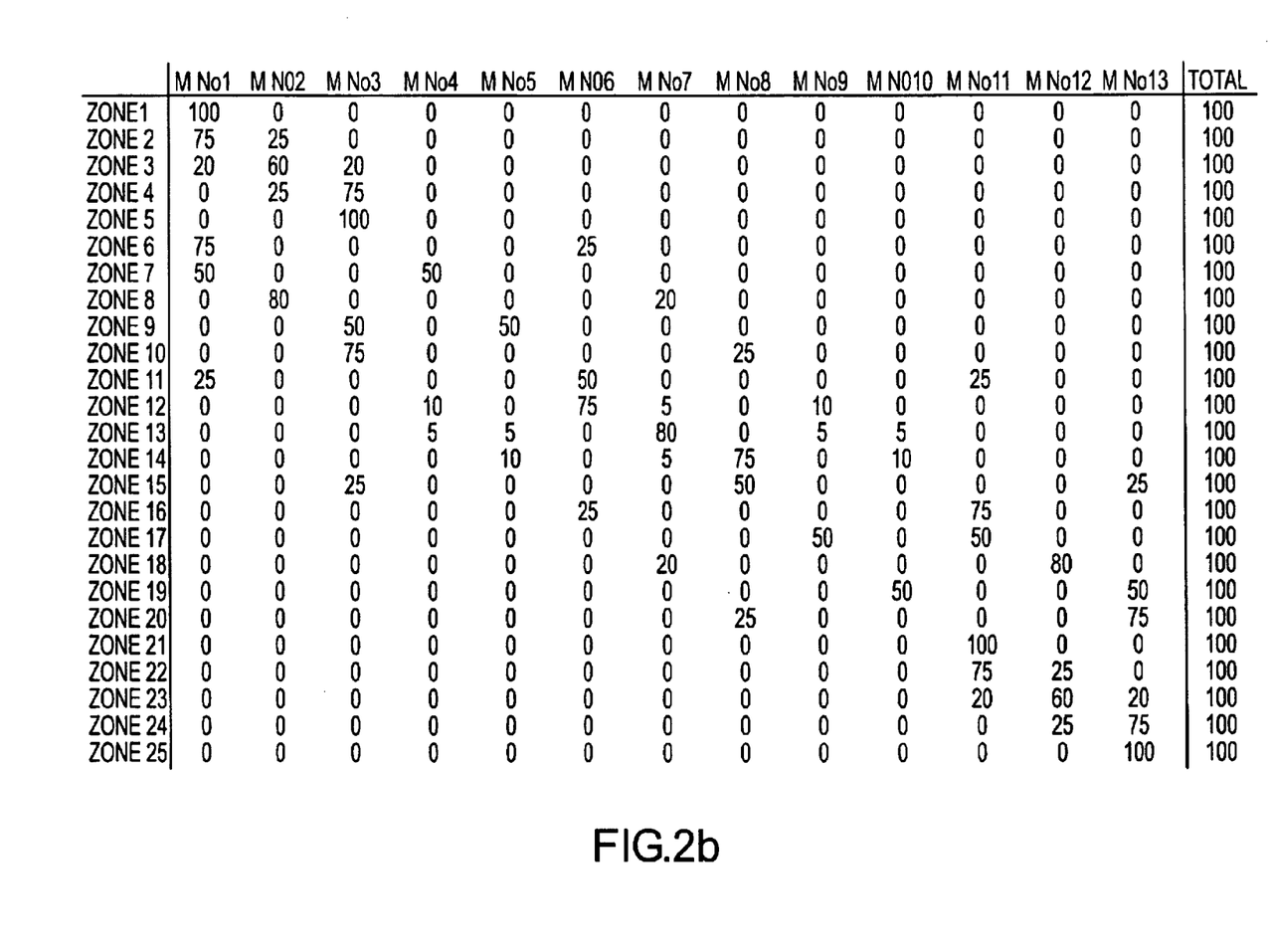
FIG. 2b shows a table that shows the influence of individual heating elements relative to certain surface points on the substrate.

The table of FIG. 2b shows an association of the individual heating zones to the surface points on the substrate. The association and weighting provided in FIG. 2 is not exact and should merely indicate the principle of a weighting. For example, the heating capacity derived from the heating zone 1 and reaching the substrate 12 influences exclusively the temperature of the substrate 12 in the region of the surface point 1. Thus, the heating zone is associated 100% to the surface point 1. In contrast hereto, the heating capacity derived from the heating zone 2, and reaching the substrate 12, influences not only the temperature of the substrate in the region of the surface point 1, but also of the surface point 2. In this connection, the heat being given off by the heating zone 2 influences the surface point 1 three times more greatly than the surface point 2. Thus, the heating zone 2 is associated with the surface points 1 and 2 in a ratio of 75:25. The table 2b show the weighted for all 25 zones of the heating plate 1.

Figure 3:
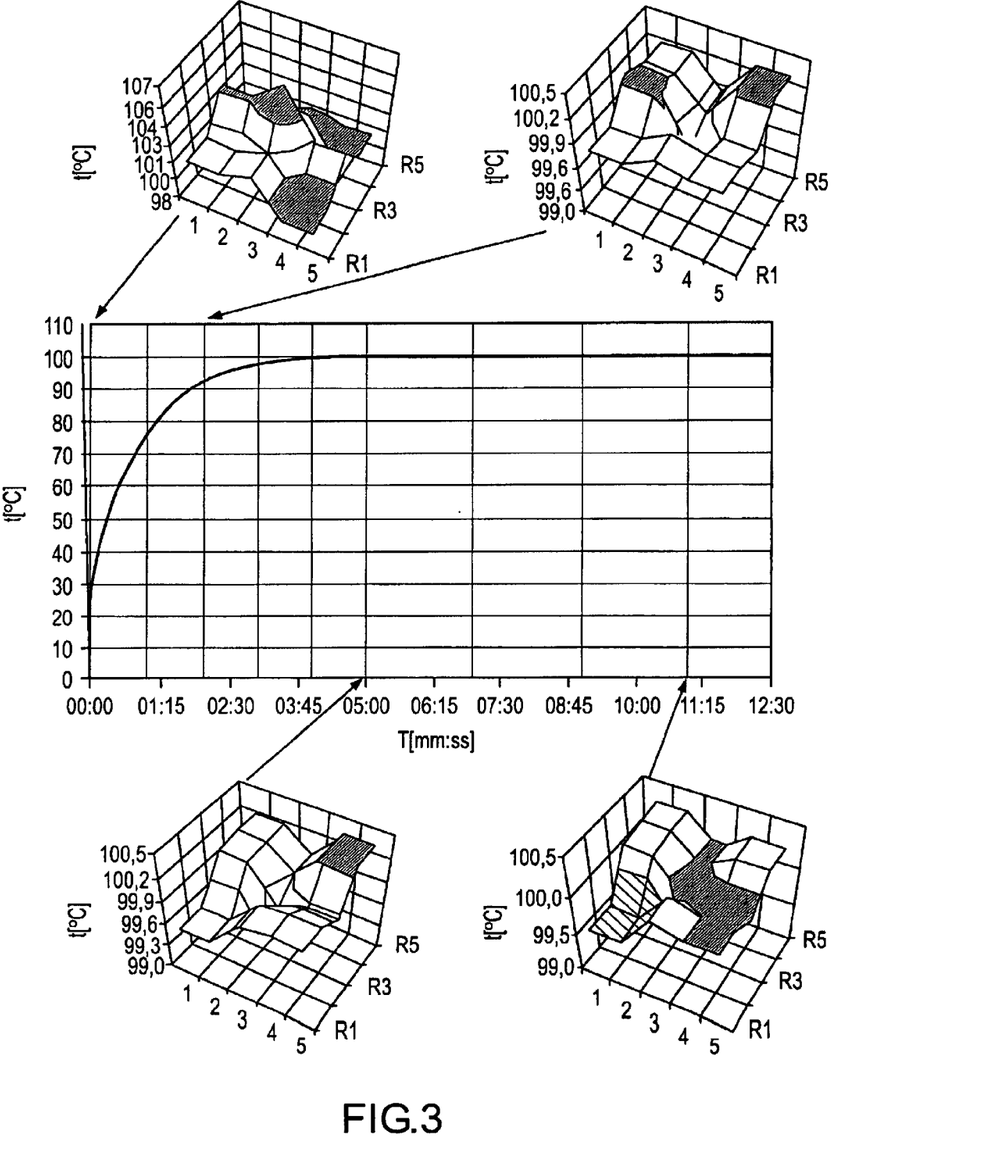
FIG. 3 shows an illustration of the chronological change of the local desired-value distribution for individual zones of a zone-controlled heating plate (5×5 heating zones) during the course of a thermal treatment of a substrate.

FIG. 3 shows four instantaneous plottings of the chronological change of a local desired-value distribution for the individual zones of a zone-controlled heating plate having 5×5 heating zones during the course of a thermal treatment of a substrate, and are grouped about a central graph. The central graph shows the chronological development of the average value of measured temperature values on the substrate surface, whereby the perpendicular lines mark the points in time at which the desired values for the individual heating zones are varied. In the central graph, the vertical axes show the temperature t in ° C., while the horizontal axis illustrates the time T in minutes and seconds. With the four instantaneous plottings of the local desired-value determinations, the desired temperature of the respective heating zones in ° C. is indicated on the vertical axis. The two other axes represent the 5×5 basic pattern of the heating zones. The upper left graph shows the desired-value distribution of the individual zones of the heating plate 2 at the beginning of the thermal treatment, i.e. in a time interval from 0 seconds to approximately 1 minute. The graph disposed next to it at the right shows the desired-value distribution of the zone-controlled heating plate at the point in time of approximately 2 minutes 5 seconds, which is maintained in the third time interval of approximately 2 minutes to 3 minutes. The lower left graph shows the desired-value distribution at the point in time of approximately 5 minutes for the sixth time interval, and the graph disposed next to it to the right shows the desired-value distribution in a final time interval, which begins at approximately 11 minutes.

As can be recognized by the upper left graph, at the beginning of the thermal treatment the central zone is heating more strongly than are the other zones, since in this region initially a relatively large mass must be heated. From the graph disposed next to it at the right one can recognize that the central zone is heated less strongly, which is attributed to the greater thermal radiation in the edge region of the substrate. In a similar manner, one can also recognize from the lower graphs that the edge zones of the heating plate are heated at least partially more strongly than is the central zone.

Figure 4A:
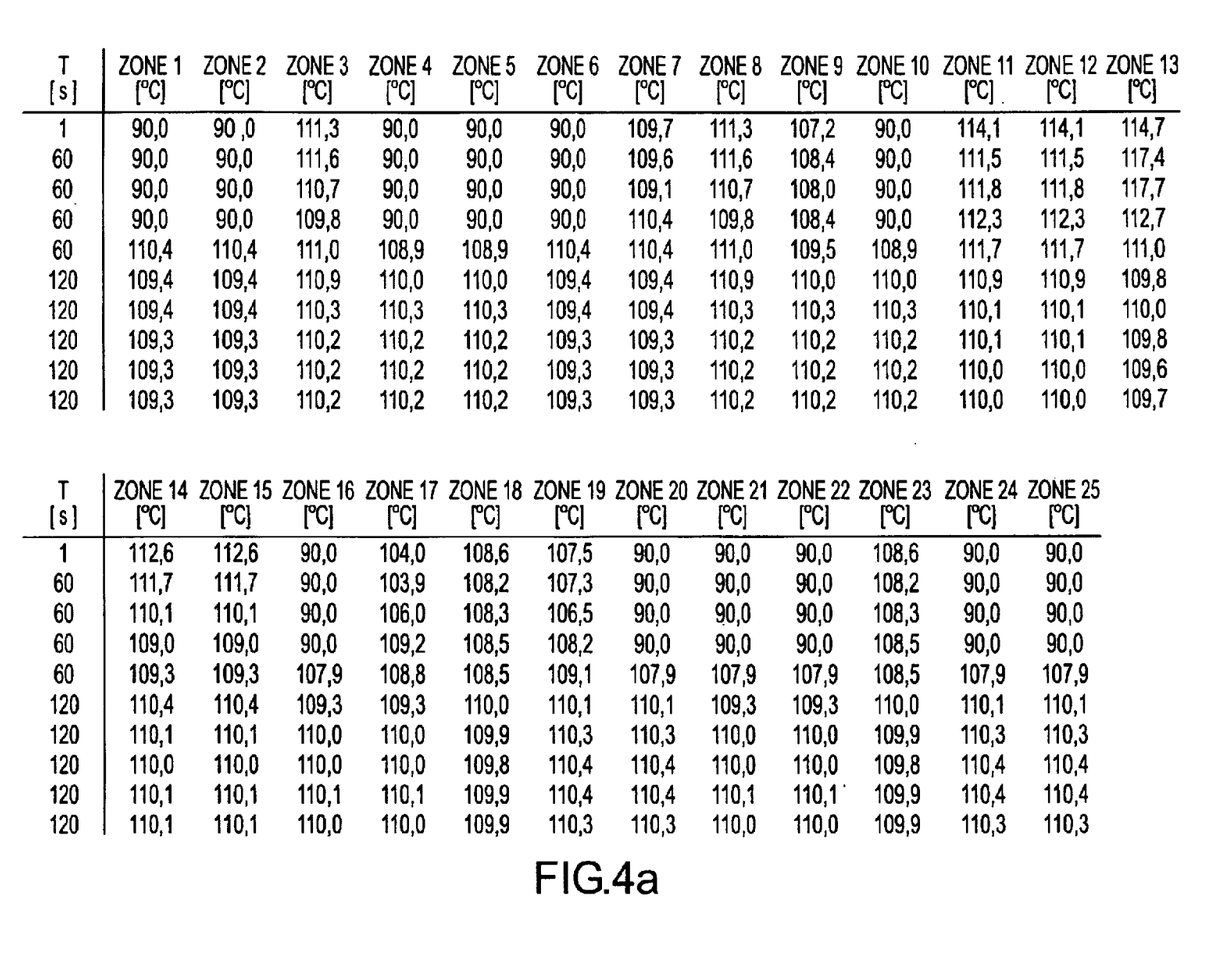
FIG. 4a shows a table of a desired-value distribution for zones of a heating plate, during a thermal treatment having an end temperature of 110° C. for a substrate.
Figure 4B:
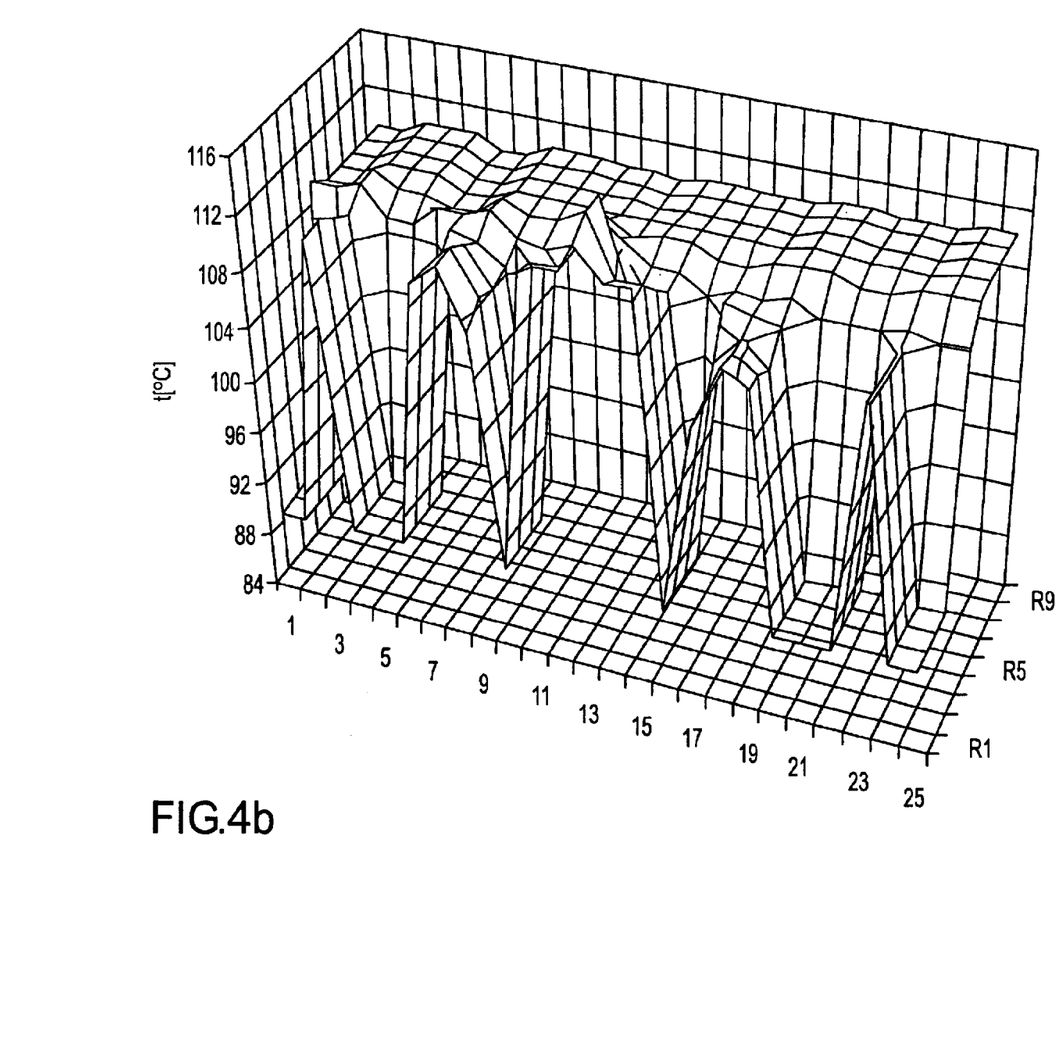
FIG. 4b shows a graphic illustration of such a desired-value profile.

FIG. 4 shows a typical profile for a thermal treatment of a mask, according to which an end temperature of 110° C. is to be achieved on the surface of the sample. In this connection, FIG. 4a shows a table for a desired-value distribution for the zones of the heating plate, whereby in the left hand column the lengths of the individual time intervals for the respective temperature step are indicated. FIG. 4b shows a three-dimensional graphic representation of the desired-value profile, whereby the vertical axis presents the temperature t in ° C., the essentially horizontally extending axis indicates the heating zones 1 to 25, and the axis that extends toward the rear shows the time intervals R1 to R9. From this three-dimensional illustration, one can clearly recognize the different control of the respective heating zones 1 to 25, whereby at the beginning of the treatment the central heating zones are heated the most strongly.

Figure 5:
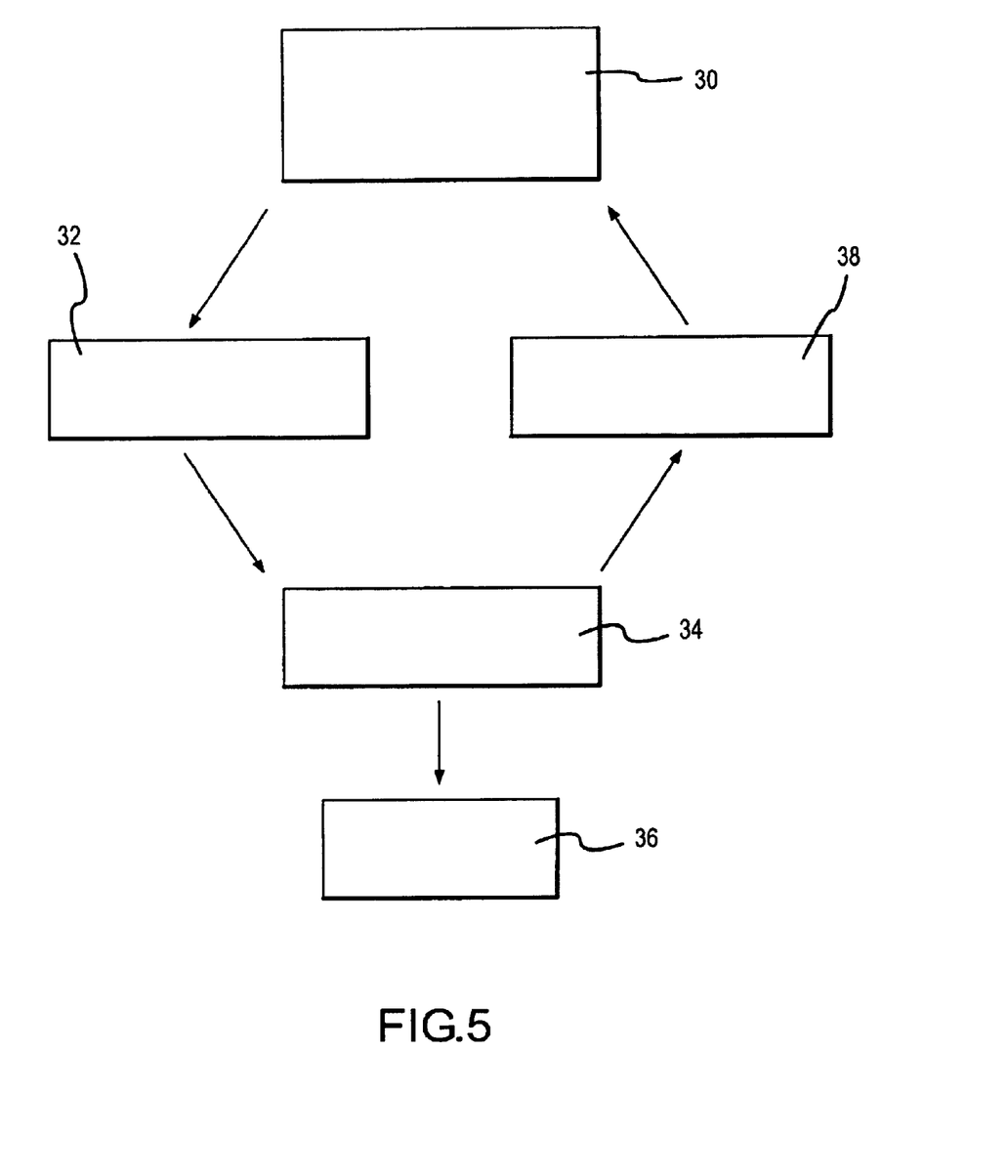
FIG. 5 shows a schematic illustration of an iteration cycle for an automatic optimization of a prescribed desired-value profile.

FIG. 5 shows an iteration cycle that during an automated optimization of a desired-value profile is used for the individual heating zones of the heating plate 2. In the block 30, a treatment cycle begins according to which a specified desired-value is prescribed for each of the 25 zones of the heating plate 2. The desired-value profiles that are used next can have any desired form, e.g. they can all be the same, or they can represent normalized starting profiles, as will be explained subsequently. The desired-value profiles are designed for the thermal treatment of a specific substrate, as well as being designed for achieving a prescribed end temperature value.

During the thermal treatment, by means of the infrared camera 17 the temperature on the surface 18 of the substrate 12 facing away from the heating elements 10 is measured and is conveyed on to the computing unit 22. In the computing unit 22, the average value of all measured values from one surface region associated with the surface point is respectively associated with the previously mentioned surface points on the surface of the substrate. This association simplifies the subsequent calculation of new desired-value profiles.

In the block 34, at each point in time of the thermal treatment, the temperature difference between the surface points on the substrate surface is determined and is compared with a predetermined threshold value. If the temperature difference at each point in time of the thermal treatment is below the threshold value, the process control proceeds to the block 36, which indicates that an optimized desired-value profile is present and no further adaptation is necessary.

However, if the temperature difference at least sometimes exceeds the threshold value, the process control proceeds to the block 38, in which the desired-value profiles are recalculated for the individual heating elements. The algorithm that is used in this connection includes a precise and weighted association or coordination of the surface points on the substrate to the zones of the heating surface. The newly calculated desired-value profile is transmitted to the start block 30 and is specified in place of the previous start profile. With this newly calculated desired-value profile, a renewed thermal treatment process is now carried out, while in the block 32 the temperature distribution on the substrate surface is measured. This iteration cycle is repeated until the temperature difference between the surface points on the substrate surface at each point in time falls below the prescribed threshold value. At this point in time, an optimized desired-value profile is established, which need no longer be interfered with. This optimized desired-value profile is used for subsequent thermal treatment processes with substrates having the same parameters and which are to be heated to the same end temperature value.

During the recalculation of the desired-value profiles, it is possible to vary not only the temperature determinations during prescribed time intervals. Rather, the length of individual time intervals can also be adapted.

The association or coordination of the surface regions of the sample to the surface points, or the association or coordination of the surface points to the zones of the heating surface, can similarly be varied.

Pursuant to the preferred embodiment of the invention, during the recalculation of the desired-value profiles the temperature inhomogeneities that occur at a specific point in time are taken into account in an anticipatory manner in order to achieve a uniform and early adaptation of the profile. If, for example, at a point in time T=50 seconds a temperature inhomogeneity occurs at a specific surface point, with the newly calculated profile this inhomogeneity is already taken into account at an earlier point in time, e.g.

T=30 seconds, in that the desired-value profile of at least one heating element is changed such that already at this point in time a locally stronger or lesser heating is effected. Thus, the temperature inhomogeneities can be provided for without temperature jumps of the heating elements and greater jumps during the desired-value determination between the individual intervals.

The above-mentioned optimization must be carried out for each different substrate as well as for each end temperature value. To save time during the determination of the ideal desired-value profile for thermal treatments having different end temperatures, initially a normalized profile is calculated. During this calculation the assumption is made that the thermal characteristic of the substrate type is essentially the same at different temperatures. Therefore, the normalized profile is formed from an optimized profile in that it is divided by the end temperature value of the optimized profile in order to obtain a normalized profile. For each further desired end temperature, the normalized profile is now multiplied with the new end value. The thus calculated desired-value profiles are then used as a start profile during the iteration cycle of FIG. 5. In so doing the number of iteration cycles prior to achieving an optimized process profile can be considerably reduced.

Profiles optimized in such a way can be made available to a customer in order to be then used, for example, in combination with the method known from DE-A-199 07 497, which to this extent is made the subject matter of the present application in order to avoid repetition. Alternatively, the optimization cycle can also be effected by customers, so that the process control is automatically self-optimized over time.

The invention was previously described with the aid of a preferred embodiment of the invention without, however, being limited to the specific embodiment. For example, the heating plate could also have some other shape, such as, for example, a round shape, with round heating elements or heating elements formed of circular segments. Instead of an infrared camera, another, localized temperature measuring device could also be used.

The specification incorporates by reference the disclosure of German priority document 100 59 665.7.4 filed Dec. 1, 2000 and PCT/EP01/13905 filed Nov. 28, 2001.

The present invention is, of course, in no way restricted to the specific disclosure of the specification and drawings, but also encompasses any modifications within the scope of the appended claims.

What is claimed is:

1. A method of thermally treating substrates, including the steps of:
    heating a substrate via a plurality of separately controllable heating elements, each of which has a prescribed desired-value profile;
    during a thermal treatment, locally measuring the temperature of a surface of the substrate facing away from the heating elements;
    determining temperature inhomogeneities occurring on said substrate surface;
    defining new desired-value profiles based on said determined temperature inhomogeneities; and
    providing said new desired-value profiles for subsequent treatment processes.

2. A method according to claim 1, wherein a temperature inhomogeneity occurring during a thermal treatment is taken into account in an anticipatory manner, in terms of time, during said definition of said desired-value profiles.

3. A method according to claim 1, wherein the temperature of said substrate surface is determined at prescribed surface points.

4. A method according to claim 3, wherein an average value of all measured temperature values from a surface region associated with a surface point is assigned to said surface points.

5. A method according to claim 4, wherein said association of said surface regions to said surface points remains constant during at least one measurement cycle.

6. A method according to claim 3, wherein said definition of a new desired-value profile is effected with the aid of a weighted association of individual ones of said surface points to said heating elements.

7. A method according to claim 6, wherein said weighted association remains constant during at least one measurement cycle.

8. A method according to claim 6, wherein said weighted association is varied during said definition of a new desired-value profile.

9. A method according to claim 1, wherein time intervals for desired-value changes are newly selected during the definition of new desired-value profiles.

10. A method according to claim 1, wherein a new definition of a desired-value profile is effected only if temperature inhomogeneities occur above a prescribed threshold value.

11. A method according to claim 1, wherein during a thermal treatment, said substrate is disposed on a plate arranged between said heating elements and said substrate.

12. A method according to claim 1, wherein as original desired-value profiles normalized desired-value profiles are used that are calculated from an optimized desired-value profile.

13. A method of optimizing desired-value profiles of a plurality of separately controllable heating elements for the thermal treatment of substrates, said method including the steps of:

heating said heating elements with the aid of respectively prescribed desired-value profiles;

during said heating step, locally measuring the temperature of a surface of a substrate facing away from said heating elements;

determining, as a function of time, temperature inhomogeneities occurring on said substrate surface;

defining new desired-value profiles based on said temperature inhomogeneities occurring during a treatment process;

using said new desired-value profiles for a subsequent heating process; and repeating the aforementioned steps until, at every point in time of said heating, said temperature inhomogeneities are below a predetermined threshold value.

14. A method according to claim 13, wherein optimization is carried out for different substrates and different end temperatures of a thermal treatment.

15. A method according to claim 13, wherein originally prescribed desired-value profiles are normalized desired-value profiles calculated based on previously optimized desired-value profiles.

* * * * *

UNITED STATES PATENT AND TRADEMARK OFFICE
CERTIFICATE OF CORRECTION

PATENT NO. : 6,919,538 B2
DATED : July 19, 2005
INVENTOR(S) : Szekeresch et al.

It is certified that error appears in the above-identified patent and that said Letters Patent is hereby corrected as shown below:

Title page,
Item [54], Title, should read as follows:
-- METHOD FOR THE THERMAL TREATMENT OF SUBSTRATES --.

Signed and Sealed this

Twentieth Day of September, 2005

JON W. DUDAS
*Director of the United States Patent and Trademark Office*